United States Patent
Tunaboylu et al.

(10) Patent No.: US 7,637,007 B2
(45) Date of Patent: Dec. 29, 2009

(54) APPROACH FOR FABRICATING CANTILEVER PROBES FOR PROBE CARD ASSEMBLIES

(75) Inventors: Bahadir Tunaboylu, Chandler, AZ (US); Horst Clauberg, Warminster, PA (US); Mark Cunningham, Queen Creek, AZ (US); Senthil Theppakuttai, Scottsdale, AZ (US); John McGlory, Chandler, AZ (US)

(73) Assignee: SV Probe Pte. Ltd., Singapore (SG)

( * ) Notice: Subject to any disclaimer, the term of this patent is extended or adjusted under 35 U.S.C. 154(b) by 191 days.

(21) Appl. No.: 11/704,050

(22) Filed: Feb. 7, 2007

(65) Prior Publication Data

US 2007/0202658 A1 Aug. 30, 2007

Related U.S. Application Data

(60) Provisional application No. 60/771,554, filed on Feb. 8, 2006.

(51) Int. Cl.
*H01K 3/02* (2006.01)
*B23P 6/00* (2006.01)
*H01L 21/76* (2006.01)

(52) U.S. Cl. .............. 29/846; 29/847; 29/842; 29/844; 29/874; 29/882; 324/754

(58) Field of Classification Search .......... 29/827, 29/831, 842, 844, 874, 882, 884; 324/754
See application file for complete search history.

(56) References Cited

U.S. PATENT DOCUMENTS 5,446,961 A * 9/1995 Levite et al. ............ 29/850

| | | | |
|---|---|---|---|
| 5,773,780 A | 6/1998 | Eldridge et al. | |
| 6,436,802 B1 * | 8/2002 | Khoury | 438/612 |
| 6,715,200 B2 * | 4/2004 | Feist et al. | 29/604 |

(Continued)

OTHER PUBLICATIONS

European Patent Office, "Notification of Transmittal of the International Search Report and the Written Opinion of the International Searching Authority, or the Declaration", International application No. PCT/US2007/003476, dated Sep. 5, 2007, 14 pages.

(Continued)

*Primary Examiner*—Derris H Banks
*Assistant Examiner*—Dan D Le
(74) *Attorney, Agent, or Firm*—Hickman Palermo Truong & Becker LLP

(57) ABSTRACT

An approach for fabricating cantilever probes for a probe card assembly includes forming posts on conductive traces on a substrate. A beam panel having beam elements formed therein is aligned to the substrate so that the beam elements are in contact with the plurality of posts. Each beam element is in contact with a post at a portion of the beam element so that both a first end portion and a second end portion overhang the post element. Each beam element is also attached to the beam panel by the first end portion. The beam elements are bonded to the plurality of posts. The first end portion of each beam element is cut, for example using an electrode, laser ablation or by dicing, to release the beam element from the beam panel. The beam panel is then removed, leaving the beam elements attached to the posts.

16 Claims, 9 Drawing Sheets

U.S. PATENT DOCUMENTS

| | | | |
|---|---|---|---|
| 6,799,976 B1 * | 10/2004 | Mok et al. | 439/55 |
| 6,925,693 B2 * | 8/2005 | Takeuchi et al. | 29/25.35 |
| 6,983,537 B2 * | 1/2006 | Park | 29/840 |
| 2001/0009376 A1 | 7/2001 | Takekoshi et al. | |
| 2003/0113990 A1 * | 6/2003 | Grube et al. | 438/612 |
| 2004/0084306 A1 * | 5/2004 | Shin et al. | 204/403.01 |
| 2005/0159740 A1 * | 7/2005 | Paul et al. | 606/41 |
| 2005/0179456 A1 | 8/2005 | Beaman et al. | |
| 2006/0214312 A1 * | 9/2006 | Wu et al. | 257/787 |

OTHER PUBLICATIONS

Claims, International application No. PCT/US2007/003476, 4 pages.

* cited by examiner

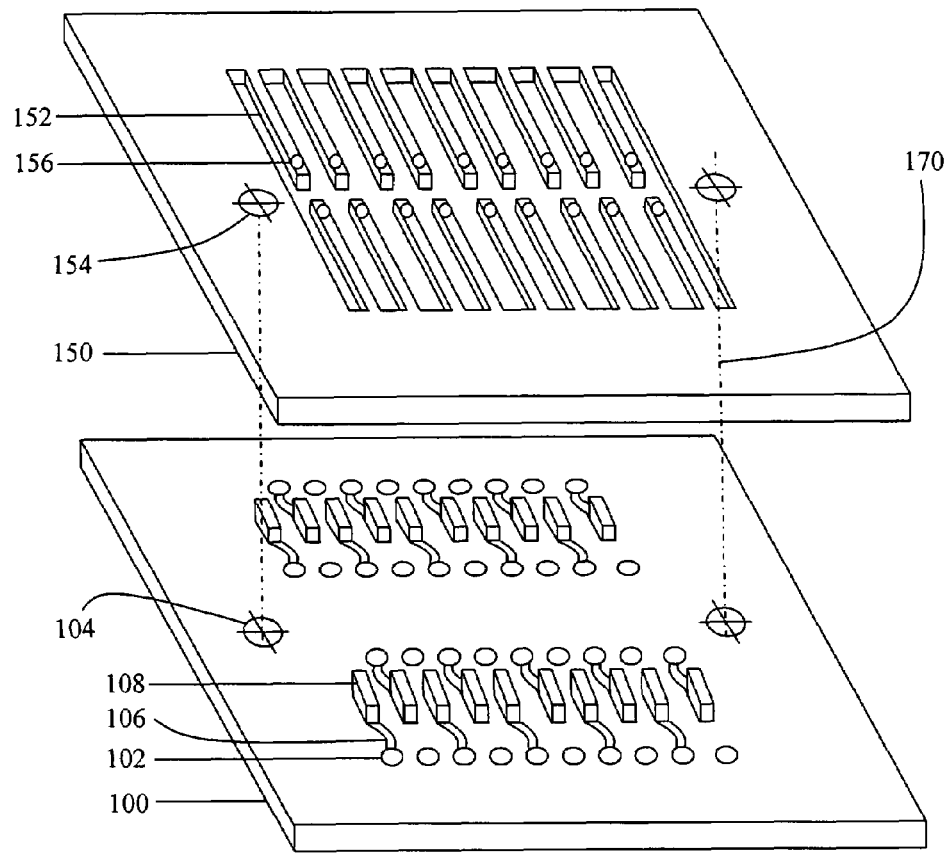
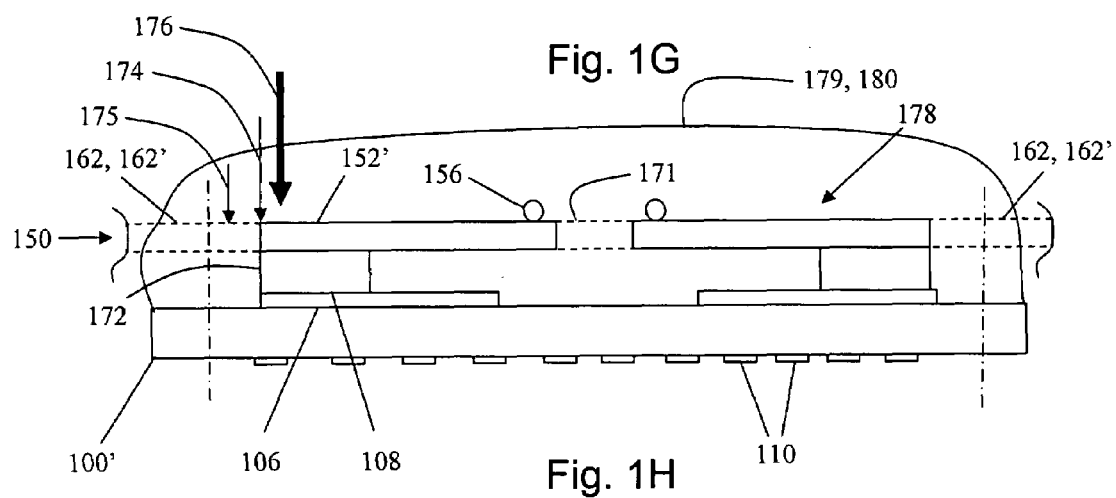
Fig. 1G
Fig. 1H

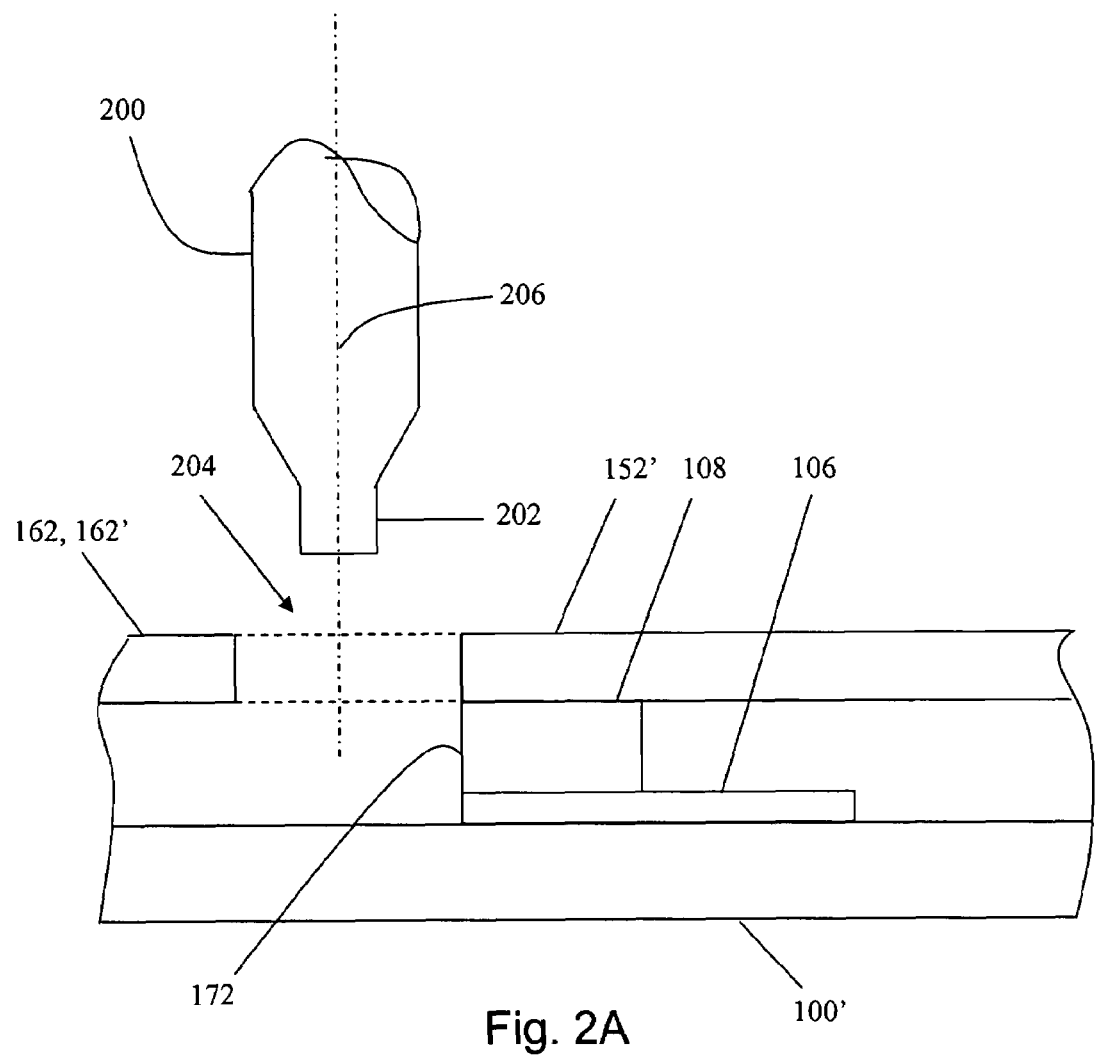

APPROACH FOR FABRICATING CANTILEVER PROBES FOR PROBE CARD ASSEMBLIES

RELATED APPLICATION DATA

This application claims the benefit of, and priority to, U.S. Provisional Patent Application No. 60/771,554, entitled Probe Card Assembly and Related Beam Cutting Methods, filed Feb. 8, 2006, the contents of which are incorporated by reference for all purposes as if fully set forth herein.

FIELD OF THE INVENTION

This invention relates generally to the fabrication of cantilever probes for probe card assemblies.

BACKGROUND

The approaches described in this section are approaches that could be pursued, but not necessarily approaches that have been previously conceived or pursued. Therefore, unless otherwise indicated, the approaches described in this section may not be prior art to the claims in this application and are not admitted to be prior art by inclusion in this section.

Cantilever electrical connector elements are widely used in the manufacture of probe cards for testing, e.g., wafer testing, integrated circuits and similar items. A cantilever electrical connector, i.e., a cantilever probe, is designed to provide electrical contact between an electrical contact point, e.g., a contact pad, on the device under test and another electrical contact point, e.g., another contact pad, on a testing apparatus. Thus, the cantilever probe provides a portion of an electrical path in a probe card assembly, where the probe card assembly provides the electrical interconnection between a device under test and a testing apparatus. Conventional cantilever probes are formed from a variety of processes, such as lithographic techniques, formed (bent) wire and stamped metal. Forming cantilever probes can be a difficult and labor intensive process. In some applications, cantilever probes are very small and must be precisely located. Further, cantilever probes are often delicate and break easily.

BRIEF DESCRIPTION OF THE DRAWINGS

In the figures of the accompanying drawings like reference numerals refer to similar elements. Various features of the drawings may not be to scale and the dimensions of the features may be arbitrarily expanded or reduced for purposes of explanation. In the description, relative terms such as "horizontal," "vertical," "up," "down," "top," and "bottom" as well as derivatives thereof (for example, "horizontally," "downwardly," "upwardly," etc.) should be construed to refer to the orientation as then described or as depicted in the figure under discussion unless otherwise specifically described. These relative terms are for convenience of description and normally are not intended to require a particular orientation. Terms "inwardly," "outwardly," "longitudinal" versus "lateral" and the like are to be interpreted relative to one another or relative to an axis of elongation, or an axis or center of rotation, as appropriate. Terms such as "connected" and "interconnected" refer to a relationship wherein structures are secured or attached to one another either directly or indirectly through intervening structures, as well as both movable or rigid attachments or relationships, unless expressly described otherwise.

FIGS. 1A-1J depict a method for forming cantilever probes in accordance with an example embodiment of the present invention;

FIG. 2A is a partial side view depicting a beam cutting method in accordance with an example embodiment of the present invention;

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are depicted in block diagram form in order to avoid unnecessarily obscuring the present invention. Various aspects of the invention are described hereinafter in the following sections:

An approach for fabricating cantilever probes for a probe card assembly generally includes forming a plurality of conductive traces on a substrate and forming a plurality of posts on the plurality of conductive traces. A beam panel having a plurality of beam elements formed therein is aligned to the substrate so that the plurality of beam elements is in contact with the plurality of posts. One or more alignment features on the substrate and the beam panel may be used to align the beam panel to the substrate so that the plurality of beam elements properly contacts the plurality of post. Each beam element includes a first end portion and a second end portion and is in contact with a post at a portion of the beam element other than the first end portion or the second end portion so that both the first end portion and the second end portion overhang the post element. Each beam element is also attached to the beam panel by the first end portion. The plurality of beam elements is bonded to the plurality of posts. The first end portion of each beam element is cut to release the beam element from the beam panel. The beam panel is then removed, leaving the plurality of beam elements attached to the plurality of posts. A variety of techniques may be used to cut the first end portion of the beam elements to release them from the beam panel. Embodiments of the invention include using an electrode, laser ablation or dicing to cut the first end portion of the beam elements to release them from the beam panel. These approaches are described in more detail hereinafter.

Figure 1A:
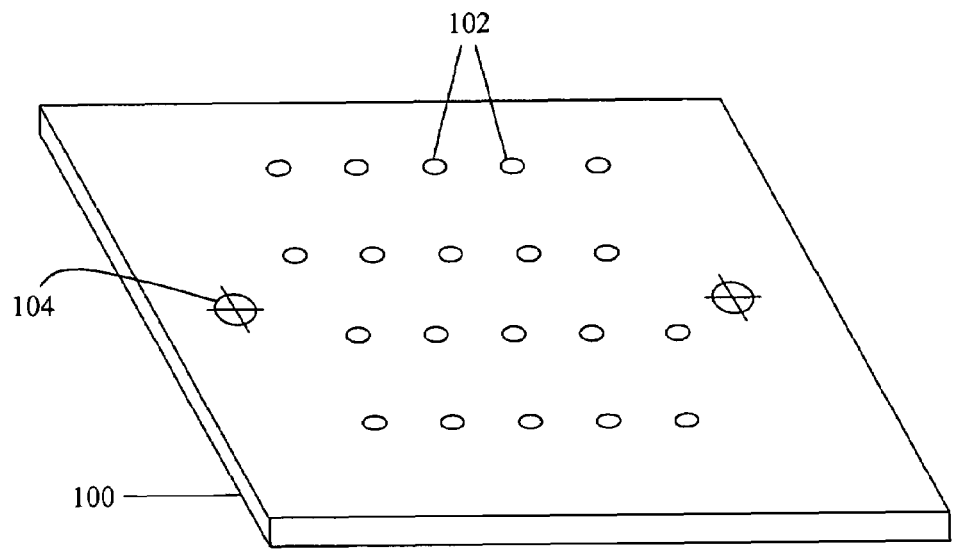

FIGS. 1A-1J are various views depicting an example process/method of forming cantilever probes. FIG. 1A is a perspective view of substrate 100 that may be, for example, a multi-layer organic (MLO) or multi-layer ceramic (MLC), etc. and that may be a space transformer. A series or array of electrically-conductive terminals 102 are provided adjacent an upper surface of substrate 100. Terminals 102 may have a width of, for example, from about 0.010" to 0.012". According to one embodiment of the invention, substrate 100 includes one or more alignment features 104 that may be, for example, apertures, protrusions, etc.

Figure 1B:
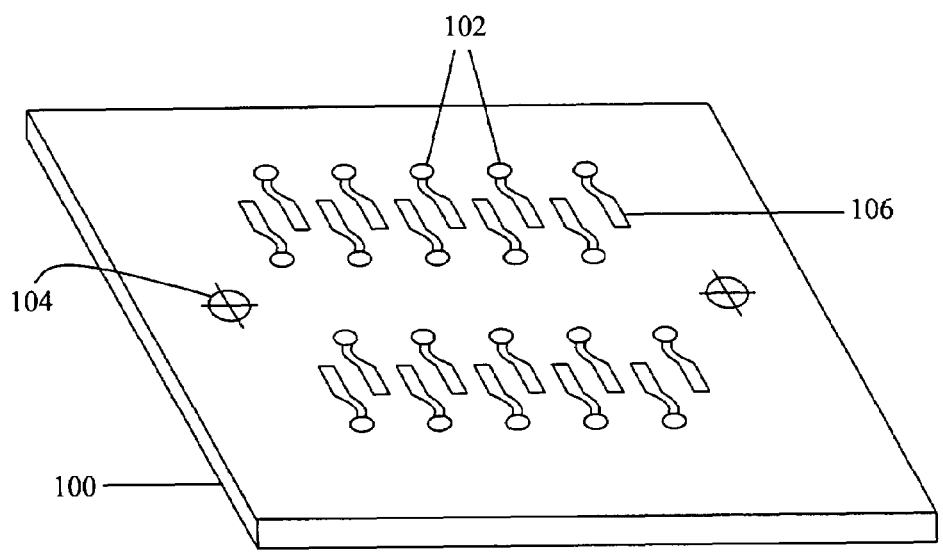

FIG. 1B depicts formation of electrically-conductive traces 106 that connect to respective terminals 102. Traces 106 may be plated using processes, for example, lithographic processes such as, for example, photolithographic, stereolithographic, or X-ray lithographic processes, etc. Traces 106 may be comprised of, for example, copper (Cu).

Figure 1C:
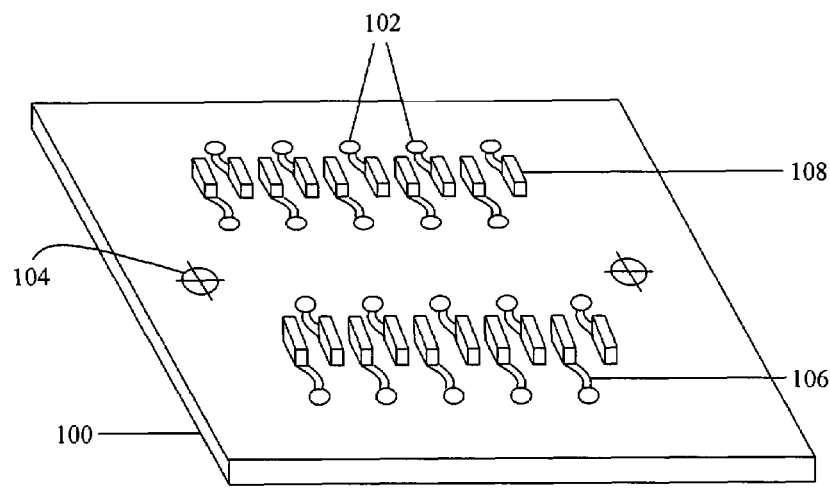

FIG. 1C depicts formation of posts 108 over respective traces 106 and generally over the distal ends of traces 106 with respect to terminals 102. Traces 106 and posts 108 are formed so that posts 108 comprise a desired array and/or alignment. Posts 108 may be formed separately and then connected to traces 106 by, for example, tab bonding, or posts 108 may be formed by plating using processes such as, for example, lithographic processes, such as, for example, photolithographic, stereolithographic, or X-ray lithographic processes, etc. and may have a thickness of, for example, about 0.0029" (75 μm).

Figure 1D:
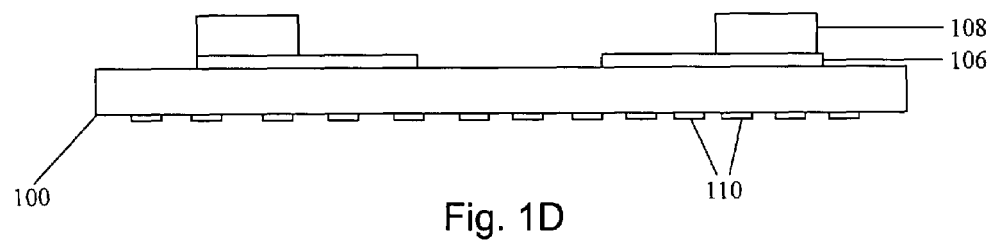

FIG. 1D is a side view of FIG. 1C depicting substrate 100, traces 106, posts 108 and bottom conductive pads 110 formed on the lower surface of substrate 100. Bottom conductive pads 110 are configured to contact other portions of a probe card assembly such as, for example, spring pins or pogo pins, etc., of an interposer (where such an interposer may connect bottom conductive pads 110 to conductive regions of a printed circuit board of the probe card assembly). Bottom conductive pads 110 may be comprised of, for example, an underlying copper layer having a thickness of, for example, about 1 to 5 mil, and a nickel manganese layer having a thickness of, for example, about 5 μm, coated with gold having a thickness of, for example, about 3 μm.

Figure 1E:
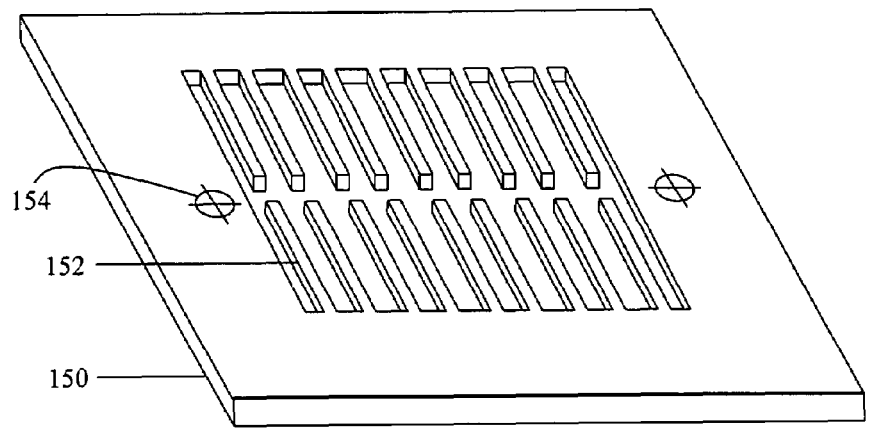
Figure 4:
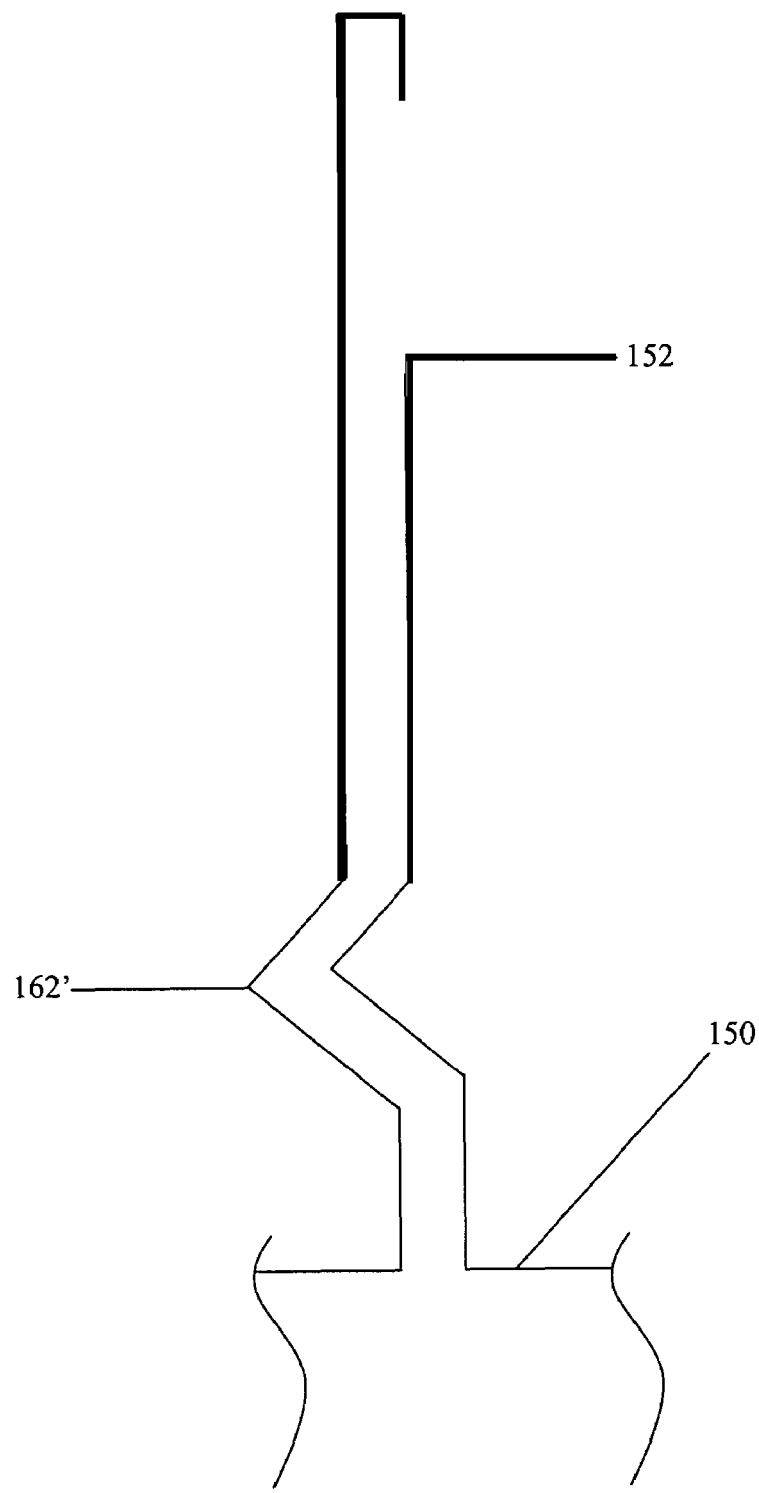
FIG. 4 depicts a portion of a probe element configured to be cut according to an example embodiment of the present invention.

FIG. 1E is a perspective view of a separate beam panel 150 having an array or series of beams 152 formed corresponding to the array of posts 108 on substrate 100. Tie bar structures (not depicted in FIG. 1E) may be formed between beams 152 and beam panel 150 as a whole and/or between beams 152. These structures may provide added mechanical support to beams 152 and/or beam panel 150 during processing and may further assist in maintaining alignment of beams 152 during processing and/or connection to posts 108. For example, structures connecting the tails of beams 152 to beam panel 150 maybe known as beam tails (see beam tails 162 depicted in FIG. 1H, for example). Beam tails may be linear (as depicted in the FIGS.) or may be roughly V-shaped and therefore known as V-bars 162' as depicted in FIG. 4, for example). Other beam tail shapes may be used. Other structures may connect the tip ends of beams 152 to beam panel 150 directly or indirectly and these may also be, for example, linear or roughly V-shaped. In either case these beam tails/tie bars may have a width/thickness less than that of beams 152 as a whole to facilitate separation from beams 152.

Beam panel 150 may be formed on a reusable support structure (not depicted) such as, for example, a stainless steel support structure. A seed metal layer, such as, for example, a copper seed layer, may be formed on the stainless steel structure before formation of beam panel 150. Beam panel 150/beams 152 may be formed by, for example, plating using processes such as, for example, lithographic processes, such as, for example, photolithographic or X-ray lithographic processes, etc. and have a thickness of, for example, about 2-3 mils. Once beams 152 are formed, beam panel 150 may be removed from the underlying support structure by, for example, peeling. Beams 152 may then be plated with, for example, gold (Au) on, for example, all exposed sides, to a thickness of, for example, about 3 μm. Beams 152 may have a thickness of, for example, about 50 μm.

According to one embodiment of the invention, beam panel 150 includes one or more alignment features 154 that may be opposite in kind to alignment features 104, for example, protrusions, apertures, etc. such that alignment features 104, 154 are configured for interconnection there between to allow proper alignment between substrate 100 and beam panel 150 when joined as described hereinafter. For example, alignment features 154 may be apertures and alignment features 104 may be posts, protrusions or fiducial eye points configured for at least partial receipt within apertures 154.

Figure 1F:
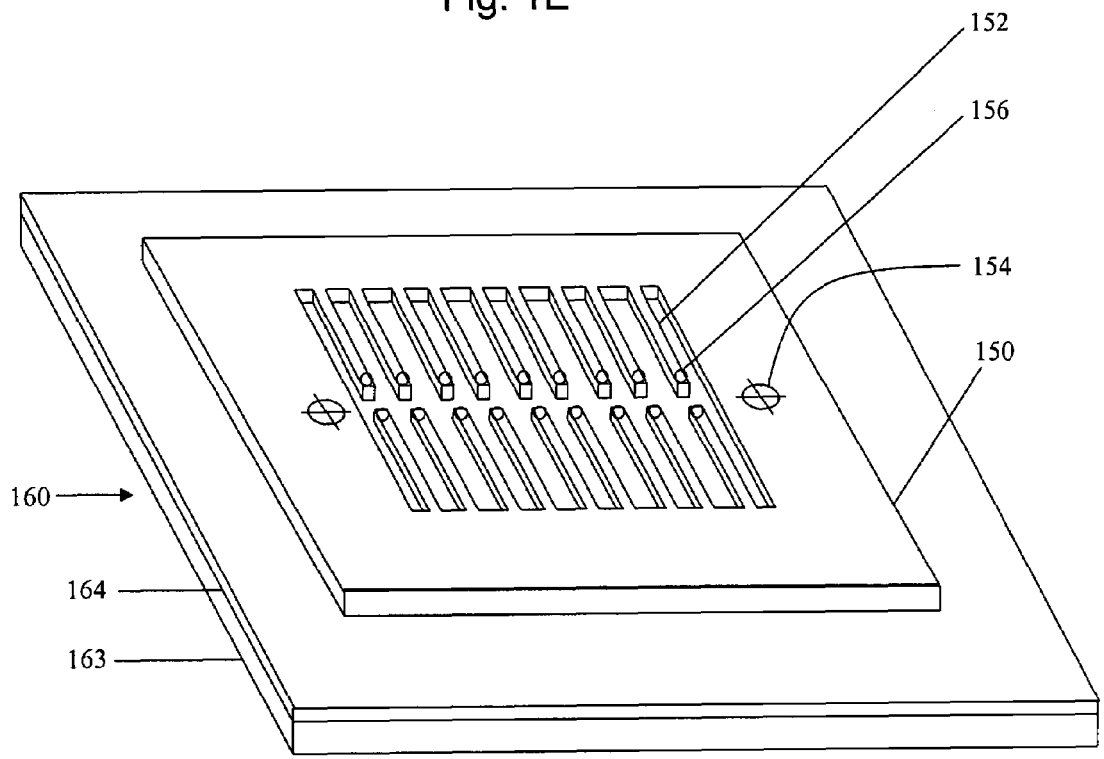

FIG. 1F depicts beam panel 150 mounted to a tip support structure 160 which may provide support for formation of optional tips 156 proximate the distal ends of beams 152. Tip support structure 160 may be comprised of, for example, stainless steel sheet 163 (or other material having a coefficient of thermal expansion (Cte) similar to the beam panel material) that may be coated with, for example, spun-on polyimide or other photoresist layer 164. Tips 156 may be formed by conventional methods or processes. After tips 156 are formed, the structure may be heated at, for example, about 250° C. for, for example, about 15 hours. Tips 156 may then be, for example, coin tipped. Tips 156 may have a height of, for example, about 0.005" (12.4 μm) and tip diameters of, for example, about 10 μm. Beam panel 150 may then be separated from tip support structure 160, by, for example, etching to release beam panel 150 from support structure coating 164.

Posts 108 (see FIG. 1D, for example) and beams 152 may each be comprised of, for example, nickel manganese, nickel, beryllium-nickel, platinum, palladium, tungsten (W), tungsten-rhenium (WRe), rhenium copper (ReCu), beryllium copper (BeCu), steel alloys including stainless steel or Paliney® 7, a precious-metal alloy comprised of gold, palladium, platinum, silver, copper and zinc (Paliney® is a registered trademark of the J. M. Ney Company, Ney Industrial Park, 2 Douglass Street, Bloomfield, Conn. 06002). Posts 108 and beams 152 may also be coated with, for example, gold (Au). Tips 156 may be stud bumps and may be comprised of, for example, platinum iridium (PtIr), platinum (Pt), platinum alloys, palladium (Pd) or palladium alloys gold (Au), copper (Cu) or silver (Ag).

FIG. 1G depicts beam panel 150 with beams 152 positioned over, and aligned with, as at 170, substrate 100 having posts 108 using respective alignment features 154, 104. Beam panel 150 and substrate may be aligned using, for example, an alignment tool (not depicted).

FIG. 1H is a side view depicting the aligned engagement of beam panel 150 with substrate 100 using respective alignment features 154, 104 (not depicted).

Beam panel 150 may be, for example, glued to substrate 100 using, for example, a glue dissolvable in acetone or other like solvent. As depicted, beams 152 are generally aligned in a substantially common plane represented by dashed lines 171. Beams 152 may then be connected with posts 108 at the lower surface proximate the end of beams 152 opposite tips 156 by, for example, tab bonding at about, for example, room temperature to form probes 178 on beam-mounted-substrate 100'. The glued structure may then be heat treated at an elevated temperature of, for example, about 100° C., for, for example about 15 hours, that may provide for optimal strengths of the tab bonds connecting beams 152 to posts 108.

Beam tails/tie bars 162 (or V-bar 162'—see FIG. 4, for example) (depicted in dashed lines) are then removed to form singulated beams 152'. A tab cutting tool (e.g., a tool with an angled end), may be pressed against each beam 152 in turn proximate end face 172 of post 108 as at arrow 174 to cut beam 152. However, the force required to separate beam 152 at arrow 174 using such a tab cutting tool may affect the tab bond between cut/singulated beam 152' and post 108.

A first alternate example method for removing beam tails 162, for example, is by using a dicing operation on a wafer saw using blades proximate end face 172 of posts 108 proximate arrow 174, for example. The wafer saw may be, for example, (a) ADT (Advanced Dicing Technologies Ltd.) Models 7100, 7200, or 7500a; (b) a saw using, for example, ADT Resin Blades or blades comprised of resin (epoxy) mixture of carbides (tungsten carbide, diamond abrasive particles; and/or (c) a saw with a blade having a thickness of, for example, about 7 mils. This dicing method may not affect the beam/post tab bond to the same extent as when employing a tab cutting tool. Any debris from the dicing operation may then be removed by, for example, air or gas pressure such as by blowing. Further, removable polymer or adhesive film 179 (see FIG. 1H, for example), for example, may also be applied over probes 178 before beam tail 162 is diced from beam 152 to avoid splashing of debris on the substrate during the dicing process. Once the dicing operation is complete, and all beam tails have been cut, any removable polymer or adhesive film 179 with any embedded/affixed debris may then be removed.

As depicted in FIG. 2A, according to another example method for removing beam tails 162, electrode 200 (e.g., a tungsten (W) electrode) having tip 202 is used to burn through beam tail 162 (at 204, for example, (proximate arrow 175 in FIG. 1H, for example)) distal to post end face 172 to form singulated beams 152'. For example, beams 152 having a thickness of about 0.002" (50 µm) spaced about 0.005" above beam-mounted-substrate 100' and about 0.003" above the top surface of trace 106, electrode 200/tip 202 may have a maximum burn width of about 0.015" so that centerline 206 of electrode 200/tip 202 may be positioned about 0.0075" from post end face 172 to ensure beam tail 162 is burned through at 204 without deleteriously affecting the tab bond between singulated beams 152' and posts 108. Electrode 200 may not physically touch or come into contact with beam tail 162 but instead an electrical current or field may be formed between electrode 200 and beam tail 162 as at 204 to burn away that portion of the beam tail.

Figure 2B:
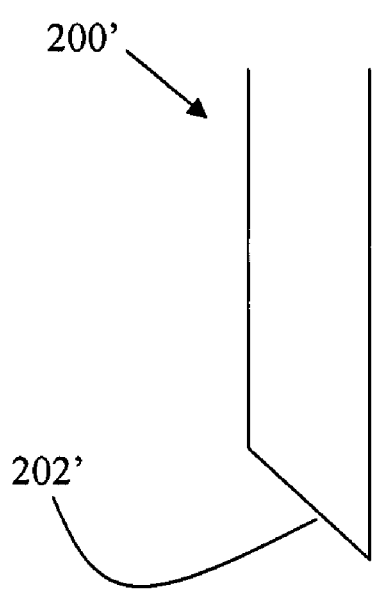
FIGS. 2B-2C are block diagrams of portions of electrodes configured for use in beam cutting methods according to various example embodiments of the present invention.
Figure 2C:
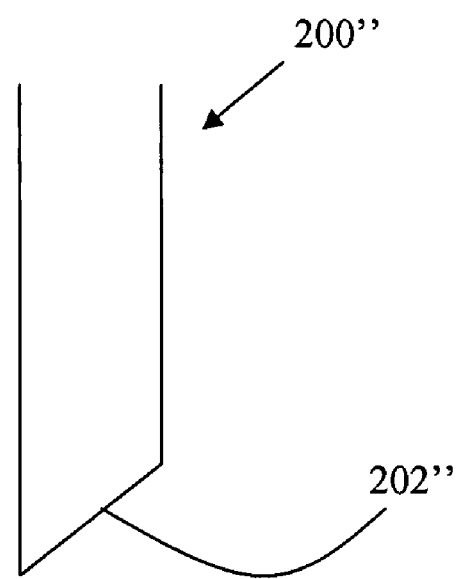

As depicted in FIGS. 2B and 2C, example electrodes 200' and 200" may have angled tip 202' (FIG. 2B) or angled tip 202" (FIG. 2C) to facilitate cleaner burn throughs of beam tails 162/V-bars 162' at 204 (see FIG. 2A, for example).

In another example method for removing beam tails 162, a removable wax or glue like substance 180 (see FIG. 1H, for example) may be applied over probes 178 and then laser ablation or the like is employed just above posts 108, that is, for example, proximate arrow 176. Wax/glue substance 180 is employed to avoid splashing of debris on the substrate during the laser cutting process and may be, for example Crystalbond™ thermoplastic polymer wash-away adhesive (a trademark of the Aremco 509 of Aremco Products, N.Y. 10989).

For example, an ESI® 5200 frequency tripled, 355 nm ND:YAG laser machine (a trademark of, and manufactured by, Electro Scientific Industries, Inc., 13900 NW Science Park Drive, Portland, Oreg. 97229-5497) may be employed in which case any container within which beam-mounted-substrate 100' may be mounted, may be loaded directly on the ESI 5200's vacuum table without any handling. This may reduce any associated handling-damage risks. After loading of substrate 100', the area to be cut may be determined by manually aligning the laser beam with beam tails/tie-bars 162 (e.g., using a microscopic vision system). The laser is positioned to cut just above posts 108 proximate arrow 176 so that traces 106 (which may underlie beam tails 162) are not damaged. Once the first beam is aligned, that entire row may be cut based upon electronic file data entered into the laser tool. The laser may, for example, be aligned to a beam 152 with an underlying trace 16 where the cut is to be made to ensure that when the/any beams with underlying traces in that row are laser cut, none of the underlying traces are damaged. For example, referring to FIG. 1G, the laser may be aligned to the left-hand most beam 152 and is then moved left to right in the lower row, and to the right-hand most beam 152 and is then moved right to left in the upper row.

Figure 3:
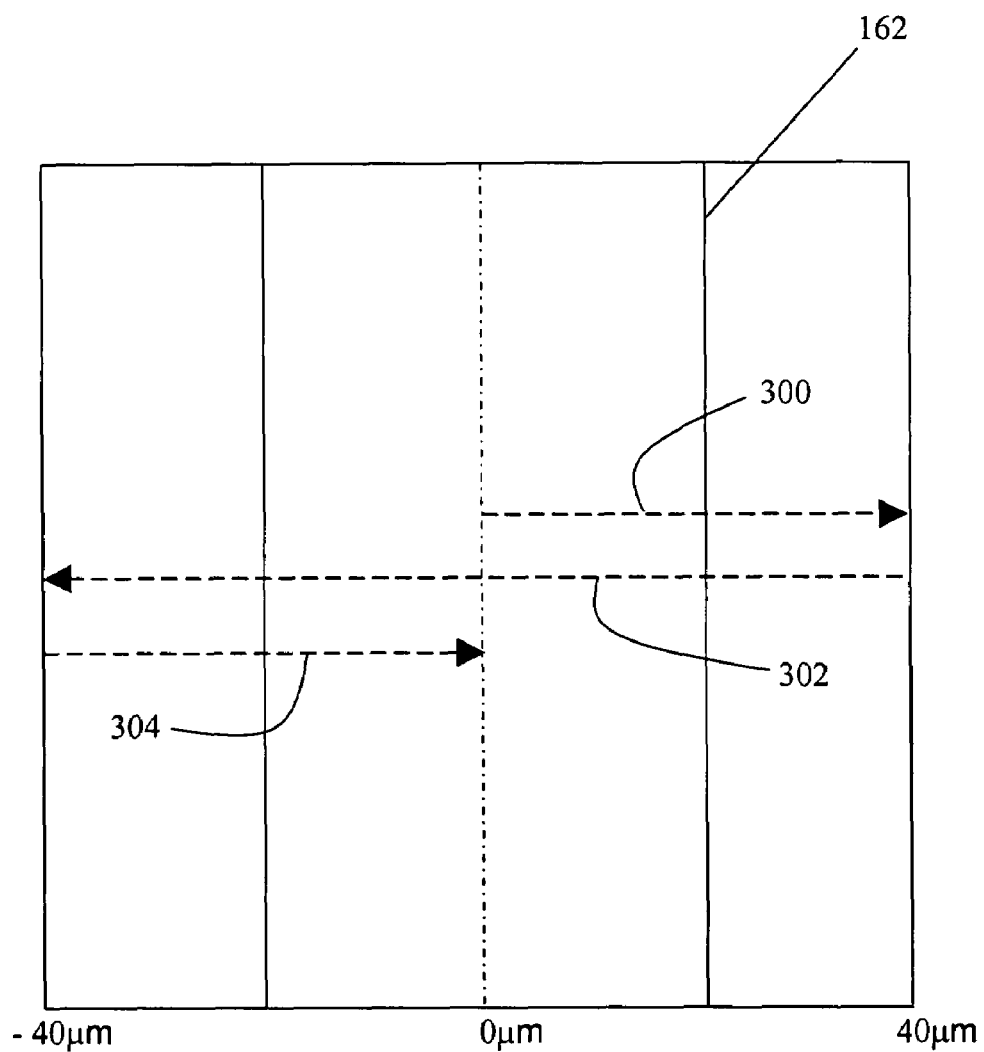
FIG. 3 is a block diagram depicting a portion of a beam cutting method in accordance with an example embodiment of the present invention.

FIG. 3 depicts an example laser tool path direction for cutting each beam 152/beam tail 162. The laser beam may start at 0 µm (for example) (proximate the centerline of beam 152/beam tail 162), goes to +40 µm (for example, based upon the width of the beam/beam tail) represented by arrow 300, then past 0 µm to −40 µm (for example, based upon the width of the beam/beam tail) represented by arrow 302 and finally back to 0 µm represented by arrow 304. This is accomplished twice at a power of about 1.3W and repeated once at a power of about 1.4W for a total of six (6) passes for cutting each beam 152/beam tail 162. Arrows 300, 302, 304 illustrate the direction of the laser beam but not necessarily the actual position of the laser beam when cutting, that is the laser beam may not actually horizontally shift as arrows 300, 302, 304 may imply (which are depicted for clarity) but instead arrows 300, 302, 304 may be superimposed. This achieves an acceptable cutting of beam 152/beam tail 162 without damage to posts 108 or any traces 106 as this motion of the laser may reduce the heat build-up in the beam 152/beam tail 162 due to this partial cutting path.

After each row is laser cut, whether a vertical row or a horizontal row, any wax/glue 180 with any embedded/attached debris is then removed, by example, dissolving in acetone or another solvent, and beam panel 150 is removed leaving probes 178 mounted to beam-mounted-substrate 100'.

It is noted that when using laser ablation, it may be easier and more efficient to cut beams 152/beam tails 162 for horizontal and vertical rows than when using a tab cutting tool as a laser may be more efficient in moving along differing axes accurately and efficiently. Alignment fiducials or similar features may also be employed in conjunction with electronic file data to automate the alignment and laser cutting of the rows of beams 152/beam tails 162 above posts 108 at arrow 176.

It is noted that the above methods/processes disclosed for removing (linear) beam tails 162 are also applicable for removing V-shaped beam tails (V-bars) 162' as depicted in FIG. 4 in yet another example embodiment of the present invention. Specifically, as depicted in FIG. 4, in an example embodiment of the present invention, the beam tails may have a V-shape and may be referred to as V-bars 162'. V-bars 162' may be unitary structures as depicted or may comprise separate connected sections and connect beams 152 to beam panel 150 as a whole and may provide some additional flexibility as compared to linear beam tails 162 of FIG. 1G, for example. This additional flexibility may aid during the positioning of beams 152 over posts 108 (see FIG. 1H, for example) and the tab bonding there between to not only more easily align beams 152 with respective posts 108, but which also may provide a stronger tab bond between respective beams 152 and posts 108. Any such strengthened tab bond may be achieved during ultrasonic bonding as the additional flexibility that may be permitted through the use of V-bars allows the ultrasonic waves to more easily/efficiently pass through beams 152 to their respective posts 108 to create a stronger bond.

Regardless of which method/process is employed to separate beam tails 162 from beams 152 to form singulated beams 152', beam panel 150 without singulated beams 152' may be removed and remaining beam-mounted-substrate 100' may be heated to, for example, about 250° C. for, for example, about 15 hours. This may serve to improve tab bond strength between the beam and the post.

Figure 1I:
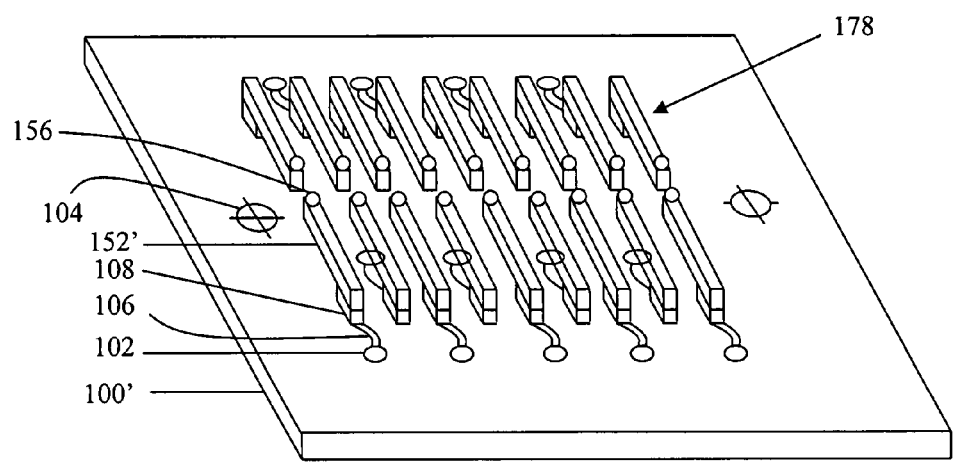

FIG. 1I is a perspective view of substrate 100 with a series of cantilever probes 178 connected thereto, thus beam-mounted-substrate 100', with each probe 178 comprising tipped beams 152' connected to posts 108. If any beams 152'/tips 156 are damaged, they may be reworked (replaced) by removing them and tab bonding new tipped beams in their place. (It is noted that not all terminals 102 and traces 106 are depicted in FIG. 1I for ease of illustration and some beams 152' are in partial phantom to depict the underlying terminals 102.

Figure 1J:
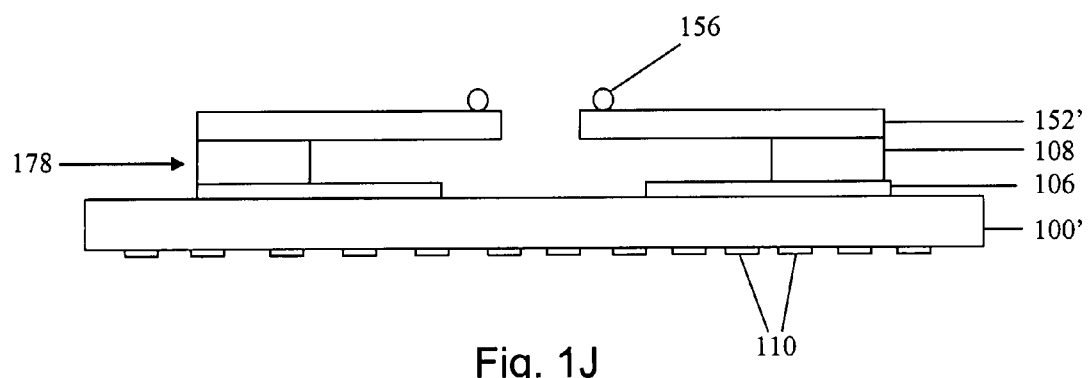

FIG. 1J is a side view of FIG. 1I depicting cantilever probes 178 having posts 108, beams 152' and tips 156. Posts 108 are affixed to traces 106 on beam-mounted-substrate 100'.

Planar/aligned beam-mounted-substrate 100' may then be assembled to a shorting block structure, or the like, at the lower surface of the substrate stiffener, for example, with an intervening interposer (not depicted), to form a probe card (not depicted). The interposer may comprise, for example, a series of spring pins or pogo pins retained within a housing so that the series of pins contacts the series of bottom conductive pads 110. Continuity checks may be performed on, for example, a ball bonder, to check continuity from the cantilever probes 178 through the interposer (spring/pogo) pins to the shorting block. The final product may then be assembled and tested (probe card analysis (PCA) validate).

While the present invention has been described primarily with respect to probe cards for wafer testing of semiconductor devices and the separation/cutting of beam tails, it is not limited thereto. Certain of the teachings may be applied to other technologies, for example, package testing of semiconductor devices and the separation/cutting of other structures such as, for example, tie bars between adjacent beams and the like. Although the invention has been described and illustrated with respect to the example embodiments thereof, it should be understood by those skilled in the art that the foregoing and various other changes, omissions and additions may be made therein and thereto, without parting from the spirit and scope of the present invention.

What is claimed is:

1. A method for fabricating probes for a probe card assembly, the method comprising:
   forming a plurality of conductive traces on a substrate;
   forming a plurality of posts on the plurality of conductive traces;
   aligning a beam panel having a plurality of beam elements formed therein to the substrate so that the plurality of beam elements are in contact with the plurality of posts and wherein:
      each beam element from the plurality of beam elements includes a first end portion and a second end portion,
      each beam element from the plurality of beam elements is in contact with a post element from the plurality of post elements at a portion of the beam element other than the first end portion or the second end portion so that both the first end portion and the second end portion overhang the post element, and
      each beam element from the plurality of beam elements is attached to the beam panel by the first end portion;
   causing the plurality of beam elements to be bonded to the plurality of posts;
   cutting the first end portion of the plurality of beam elements to release the plurality of beam elements from the beam panel; and
   removing the beam panel, leaving the plurality of beam elements attached to the plurality of post elements.

2. The method as recited in claim 1, wherein the cutting the first end portion of the plurality of beam elements to release the plurality of beam elements from the beam panel is performed using laser ablation.

3. The method as recited in claim 2, further comprising after causing the plurality of beam elements to be bonded to the plurality of posts, applying a protective layer over the plurality of beams, the plurality of posts and the plurality of conductive traces to protect the plurality of beams, the plurality of posts and the plurality of conductive traces from debris created during the cutting of the first end portion of the plurality of beam elements.

4. The method as recited in claim 3, wherein the protective layer is one or more of a wax-based material or a glue-based material.

5. The method as recited in claim 3, further comprising after cutting the first end portion of the plurality of beam elements to release the plurality of beam elements from the beam panel, removing the protective layer from the plurality of beams, the plurality of posts and the plurality of conductive traces to protect the plurality of beams, the plurality of posts and the plurality of conductive traces.

6. The method as recited in claim 2, wherein the cutting the first end portion of the plurality of beam elements using laser ablation to release the plurality of beam elements from the beam panel includes using at least one cutting path having a length less than the width of a beam element, wherein the laser ablation is applied to the cutting path multiple times.

7. The method as recited in claim 2, wherein the cutting the first end portion of the plurality of beam elements using laser ablation to release the plurality of beam elements from the beam panel is performed using multiple passes with a laser.

8. The method as recited in claim 1, wherein the cutting the first end portion of the plurality of beam elements to release the plurality of beam elements from the beam panel is performed using an electrode.

9. The method as recited in claim 8, wherein the cutting the first end portion of the plurality of beam elements to release the plurality of beam elements from the beam panel using an electrode includes positioning the electrode adjacent, but not in contact with, the first end portion of each beam element.

10. The method as recited in claim 8, wherein the cutting the first end portion of the plurality of beam elements to release the plurality of beam elements from the beam panel using an electrode includes the use of an electrode having an angled tip.

11. The method as recited in claim 1, wherein the cutting the first end portion of the plurality of beam elements to release the plurality of beam elements from the beam panel is performed adjacent a face portion of each of the plurality of posts so that there is substantially no overhang of the plurality of posts by the beam elements on the first end portion sides of the beam elements.

12. The method as recited in claim 1, wherein the cutting the first end portion of the plurality of beam elements to release the plurality of beam elements from the beam panel is performed by dicing using one or more saw blades.

13. The method as recited in claim 1, wherein for at least one of the plurality of beam elements, the portion of the beam element other than the first end portion or the second end portion is v-shaped.

14. The method as recited in claim 1, wherein for at least one of the plurality of beam elements, the portion of the beam element other than the first end portion or the second end portion is one or more of thinner or narrower than the rest of the beam element.

15. The method as recited in claim 1, wherein for at least one of the plurality of beam elements, the portion of the beam element other than the first end portion or the second end portion is structurally weaker than the rest of the beam element.

16. The method as recited in claim 1, wherein:

the substrate includes one or more alignment features, the beam panel includes one or more alignment features, and the aligning of the beam panel to the substrate includes aligning the one or more alignment features on the beam panel with the one or more alignment features on the substrate.

* * * * *